(12) United States Patent
Mowry et al.

(10) Patent No.: US 8,212,184 B2
(45) Date of Patent: Jul. 3, 2012

(54) COLD TEMPERATURE CONTROL IN A SEMICONDUCTOR DEVICE

(75) Inventors: Anthony Mowry, Buda, TX (US); Casey Scott, Dresden (DE); Maciej Wiatr, Dresden (DE); Ralf Richter, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 660 days.

(21) Appl. No.: 12/390,816

(22) Filed: Feb. 23, 2009

(65) Prior Publication Data
US 2009/0295457 A1 Dec. 3, 2009

(30) Foreign Application Priority Data
May 30, 2008 (DE) .................. 10 2008 026 135

(51) Int. Cl.
*H05B 1/00* (2006.01)
*H01L 35/00* (2006.01)
(52) U.S. Cl. ........ 219/209; 219/210; 219/481; 219/494; 219/548; 327/513; 326/93
(58) Field of Classification Search .................. 219/209, 219/210, 481, 494, 548; 327/512–3; 324/158.1; 326/93
See application file for complete search history.

(56) References Cited

U.S. PATENT DOCUMENTS

| 4,374,316 | A | 2/1983 | Inamori et al. ................ 219/209 |
| 5,896,259 | A | 4/1999 | Farwell et al. .................. 361/78 |
| 6,563,227 | B1 * | 5/2003 | Strnad ............................ 257/414 |
| 6,798,706 | B2 * | 9/2004 | Barth et al. .................... 365/211 |
| 6,815,643 | B2 * | 11/2004 | Der Ropp ..................... 219/209 |

FOREIGN PATENT DOCUMENTS

| DE | 101 32 763 A1 | | 1/2003 |
| DE | 10132763 | * | 1/2003 |
| JP | 60-085552 | * | 5/1985 |
| JP | 60085552 A | | 5/1985 |

OTHER PUBLICATIONS

Translation of Official Communication from German Patent Office for German Patent Application No. 10 2008 026 135.1-33 dated Feb. 23, 2009.

\* cited by examiner

*Primary Examiner* — Shawntina Fuqua
(74) *Attorney, Agent, or Firm* — Williams, Morgan & Amerson, P.C.

(57) ABSTRACT

Operation of complex integrated circuits at low temperatures may be enhanced by providing active heating elements within the integrated circuit so as to raise the temperature of at least critical circuit portions at respective operational phases, such as upon power-up. Consequently, enhanced cold temperature performance may be obtained on the basis of existing process elements in order to provide design stability without requiring extensive circuit simulation or redesign of well-established circuit architectures.

25 Claims, 8 Drawing Sheets

COLD TEMPERATURE CONTROL IN A SEMICONDUCTOR DEVICE

BACKGROUND

1. Field of the Disclosure

Generally, the present disclosure relates to integrated circuits, and, more particularly, to enhanced temperature control techniques in semiconductor devices.

2. Description of the Related Art

The fabrication of integrated circuits requires a large number of circuit elements, such as transistors and the like, to be formed on a given chip area according to a specified circuit layout. Generally, a plurality of process technologies are currently practiced, such as CMOS technology for complex circuitry, such as microprocessors, storage chips, ASICs (application specific ICs) and the like, bipolar techniques, a mixture of these techniques and the like, wherein, due to recent advances, complex systems may be formed on a single die, which may also comprise complex analog circuit portions. During the fabrication of complex integrated circuits using any appropriate technology, millions of transistors, such as N-channel transistors and P-channel transistors in MOS technology, bipolar transistors, diode structures and the like, are typically formed on a substrate including a crystalline semiconductor layer. A transistor, irrespective of whether field effect transistors or bipolar transistors are considered, comprises so-called PN junctions that are formed by an interface of highly doped regions, such as drain and source regions, with an inversely or weakly doped region, such as a channel region, disposed between the highly doped regions. The overall conductivity of the transistors, i.e., the drive current capability, is controlled by a gate electrode or a base terminal by applying an appropriate control voltage or control current. Since the critical conductive paths within the transistors are provided in the form of doped semiconductor regions, the overall behavior of the individual transistor elements strongly depends on the temperature of the semiconductor material, wherein, in bipolar transistors, conductivity may increase with increasing temperature, while, in MOS transistors, an inverse relation between drive current and temperature may typically be observed. Although temperature stability of circuit portions may be significantly increased by appropriately designing the basic circuit function and applying sophisticated layout concepts, nevertheless, advanced temperature controlling may be required.

For example, the increased packing density of integrated circuits resulting from the reduced device dimensions has given rise to the incorporation of more and more functions into a single semiconductor die. Furthermore, the reduced feature sizes may also be accompanied by reduced switching speeds of the individual transistors, thereby contributing to increased power consumption in MOS circuits, since the reduced switching speeds allow the operation of the transistors at higher switching frequencies, which in turn increases the power consumption of the entire device. In sophisticated applications using densely packed integrated circuits, the heat generation may reach extremely high values due to the dynamic losses caused by the high operating frequency in combination with a significant static power consumption of highly scaled transistor devices owing to increased leakage currents that may stem from extremely thin gate dielectrics, short channel effects and the like. Therefore, great efforts are being made in order to reduce overall power consumption by restricting the usage of high performance transistors, which usually cause higher heat generation, to performance critical signal paths in the circuit design, while using less critical devices in other circuit areas. Moreover, appropriate mechanisms may be implemented to operate certain circuit portions "on demand" and control local or global operating conditions depending on the thermal situation in the semiconductor die. Since external heat management systems may not enable a reliable estimation of the die internal temperature distribution due to the delayed thermal response of the package of the semiconductor device and the possibly insufficient spatial temperature resolution, respective external concepts may have to be designed to take into consideration these restrictions and provide sufficient operational margins with respect to heat control or to risk overheating and thus possibly destruction of specific critical circuit portions.

Manufacturers of semiconductor products, therefore, increasingly prefer accurate internal temperature measurements that do not substantially depend on external device conditions and dedicated thermal hardware components that may be subject to external tampering, while also avoiding the slow thermal response via the device package. For this purpose, sophisticated heat monitoring regimes may typically be incorporated into the overall design of the integrated circuit, which may enable a device internal heat management irrespective of external conditions. Thus, die internal temperature measurements are typically performed in complex devices, such as CPUs, ASICs and the like, so as to provide device internal data for controlling the overall operation by reducing operating frequency, switching off respective circuit portions and the like.

Consequently, great efforts are being made in view of enhancing temperature management within integrated circuits for given heat dissipation capabilities of the integrated circuit chip and its environment substantially without sacrificing performance of the integrated circuit. On the other hand, the increasing miniaturization of advanced integrated circuits and the corresponding gain in performance and functionality associated therewith may enable the usage of integrated circuits in a wide field of applications which may have previously been excluded. For instance, complex embedded systems, low power applications in mobile devices and the like are rapidly growing fields in which sophisticated integrated circuits are used, and will increasingly be used in the future. Due to the wide variety of possible applications of these devices, very different environmental conditions may be encountered during operation of the devices, such as mobile computers, mobile communication systems with a high degree of complexity and the like. Consequently, many integrated circuits, or at least significant portions thereof, which may have been designed with respect to well-defined environmental conditions and in particular with respect to well-defined temperature ranges, the application of these circuit designs may not be "portable" to more sophisticated environmental conditions without significant redesign, which may therefore result in increased cost due to extensive circuit simulations and resulting reconfiguring of well-established circuit portions. Typically, the semiconductor manufacturers are mostly concerned with high temperature environments which may be caused by the self-heating of the integrated circuit itself, possibly in combination with externally supplied heat, wherein typical in-die thermal sensing circuitry may be provided, as previously indicated, in combination with passive cooling systems within a die and the package of the integrated circuit, which may then be assisted by active cooling systems provided in the periphery of the integrated circuit. However, little attention has been given to the operational behavior of complex circuitry at low temperatures, which may increasingly be encountered as the number of portable devices, such as laptops and embedded system, is growing. Consequently, an increasing number of mobile systems or any other systems may potentially be used in cold environments, which per se would not represent an issue if individual circuit elements would be considered, which, however, in a complex system including a CPU, possibly in combination with analog circuitry, such as phase locked loop units (PLL), delay locked loop units (DLL) or resonant components (RLC) may suffer from performance deterioration. For example, a mobile computer may be stored in a car overnight at a cold temperature and may then be switched on before the system is brought to a temperature range for which the basic circuit portions of the mobile computer are designed. In other cases, using complex systems in cold climates, such as Alaska or Siberia, may cause significant issues with respect to device reliability and performance, since although individual components of the system may have temperature ratings that may cover the encountered environmental conditions, a system as a whole may not necessarily function properly, for instance due to subtle process variations during the fabrication of a certain line of products. Increasing the temperature range for a reliable operation of complex systems, however, may require significant redesign of circuit portions, such as clock trees and the like, which may therefore require moderately long development times due to voluminous circuit simulations, thereby contributing to significant production costs.

The present disclosure is directed to various devices and methods that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

The present disclosure generally relates to integrated circuits and methods in which, in addition to taking into consideration issues related with high temperature operation, also attention is given to low temperature operation such that a reliable operation of complex integrated circuits, such as CPUs and the like, may be extended at the low temperature side of the temperature specification without requiring significant redesigns and extensive circuit simulation. It has been recognized that, typically, in complex integrated circuits, low temperature related problems may be associated with analog circuitry, such as PLLs, DLLs or RLCs, which may be a reason for improper operation of the integrated circuit, for instance the devices may fail to boot, may lose clock lock and the like. In other cases, stability of static RAM cells may be reduced at low temperature operation which may thus result in data loss or even in non-reliable operational behavior of the entire system. Since these low temperature related issues may typically disappear once the temperature of the integrated circuit has reached a critical temperature due to internal heat dissipation, the present disclosure provides techniques in which minor modifications of the integrated circuits may be used, for instance, by providing heating elements in critical device areas in order to temporarily increase temperature, thereby shifting the "environmental" conditions of critical circuit portions into a "normal" operating range. Consequently, by identifying critical circuit portions in view of cold temperature operation, well-established techniques and circuit devices may be implemented into existing well-approved circuit layouts without requiring significant modifications and circuit simulations, so that the available temperature range may be significantly extended at the lower end substantially without increasing overall production costs since, for instance, active heating elements, such as resistive structures, thermal couples and the like, may readily be incorporated without additional process complexity.

One illustrative semiconductor device disclosed herein comprises a plurality of circuit elements representing a functional circuit portion that is formed in a die region. The semiconductor device further comprises at least one heating element formed in the die region, wherein the at least one heating element is functionally independent from the functional circuit portion and is thermally coupled therewith. Finally, the semiconductor device comprises a control mechanism configured to activate the at least one heating element, at least when a temperature of the functional circuit portion is below a specified threshold.

A further illustrative semiconductor device disclosed herein comprises a temperature sensitive circuit portion that comprises a plurality of circuit elements formed in and above a semiconductor layer. Moreover, the semiconductor device comprises a second circuit portion formed at least in and above the semiconductor layer and positioned to be in thermal communication with the temperature sensitive circuit portion. The second circuit portion is configured to be activated independently from the temperature sensitive circuit portion at least when a representative current temperature thereof is below a specified threshold.

One illustrative method disclosed herein comprises determining a representative temperature of at least one circuit portion of an integrated circuit. The method additionally comprises supplying heat to the at least one circuit portion when the determined representative temperature is below a specified threshold.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to semiconductor devices and methods of operating the same, in which a reliable operation of the integrated circuits, even if combined with complex systems, may be extended at the low temperature range by actively heating critical circuit portions when a representative temperature thereof is below a specified threshold. For this purpose, die internal heating elements may be provided so as to be in thermal contact with the critical circuit portions and/or other circuit portions which may be operated at low temperature and which may dissipate excessive heat during operation and may be positioned in thermal contact with the cold temperature sensitive circuit portions without requiring a basic redesign of the respective circuit blocks. In some illustrative aspects disclosed herein, the heating may involve a highly localized heating, for instance at transistor level, so as to obtain a desired temperature raise locally without requiring significant amounts of energy. This may be highly advantageous with respect to applications in which the available energy source may be restricted in capacity, such as in portable devices and the like. In other cases, a more-or-less unspecific heating of the die region may be initiated by die internal heating elements when power saving criteria are less important. The selective heating or the more-or-less unspecific heat may be applied when at least one critical circuit portion may have a temperature below a predefined threshold, wherein the active heating may be maintained over a certain predefined time interval or may be controlled in a temperature or time-dependent manner, depending on the overall process strategy. In other cases, active heating may be applied at specific operational stages, for instance during a power-up phase, irrespective of the actually detected die temperature. Thus, in this case, it may be assumed the temperature of sensitive circuit portions may be below a specific threshold compared to a typical temperature during a standard operational phase of the circuit portion under consideration, thereby simplifying the overall control mechanism for actively heating local portions for the entire die region. For example, a corresponding time interval for actively heating at least a critical circuit portion of the integrated circuit may be implemented into the initialization phase, such as the booting of a microprocessor, thereby providing reliable operation of the device substantially independent from the environmental conditions. In some illustrative embodiments, a decision may be made during the initialization of the integrated circuit as to whether a currently detected representative temperature is below or above a critical threshold value. In this case, active heating may be applied for temperatures at which a reliable operation of critical circuit portions, such as lock trees of the CPU, critical analog circuitry, such as phase lock loop units and the like, may not be guaranteed. Consequently, power consumption for actively heating die internal heating elements may be restricted to critical environmental conditions.

As previously explained, appropriate heating elements may be readily implemented into the overall circuit configuration on the basis of well-established techniques, such as the incorporation of resistive structures at any appropriate location and level of the semiconductor device under consideration, without requiring a significant redesign of the basic circuit architecture. Consequently, the principles disclosed herein are highly compatible with well-established circuit configurations and process techniques so that an extended range of environmental temperatures may be provided substantially without adding to process complexity and production costs. For example, existing dummy structures, such as polysilicon lines, which may be provided in view of enhancing lithography processes and the like, may be readily "converted" into active heating elements for providing appropriate contact in order to enable a current flow across the dummy structures in order to create heat in a highly local manner. In other cases, circuit simulation may indicate a critical behavior at low temperatures for a certain circuit portion, wherein, according to the principles disclosed herein, a basic reconfiguration of the circuit portion under consideration may be avoided by, for instance, providing respective heating elements close to the circuit portion under consideration and/or by appropriately modifying the thermal conductivity, for instance in the contact level of the device, to create a desired enhanced thermal communication between a dedicated heating element or a circuit portion that may be reliably operated at low temperatures in order to use the waste heat thereof for bringing the temperature sensitive circuit portion up to a "safe" operating temperature. In this context, a thermal communication between two components is to be understood as the ability to exchange heat, wherein the two components may be in direct physical contact or the heat transfer may be via an intermediate medium, such as materials that may be in contact with both components. In other cases, a certain degree of "redesign" may be used by appropriately positioning cold temperature sensitive circuit portions in the vicinity of non-sensitive circuit portions, which may be operated so as to supply heat to the critical circuit portions, however without requiring a basic redesign of the circuit architectures of the circuit portions under consideration. In still other illustrative aspects disclosed herein, thermocouples may be used within an appropriate device level, such as the contact level, to initiate heat transfer between two circuit areas, which may thus allow creating heat at a low temperature phase and may also allow dissipating heat, if required. For this purpose, well-established materials used in forming semiconductor devices may also be employed for forming appropriate thermocouples, thereby providing a high degree of compatibility with existing technologies. For example, copper, constantan (i.e., a copper nickel alloy), platinum, rhodium and the like may represent appropriate materials for forming thermocouples, wherein many of these materials are also used in other manufacturing stages of modern semiconductor devices, or which are at least compatible with respective processes. By providing respective thermocouples and/or appropriately patterning the thermal conductivity of an appropriate device level, such as the contact level, a substrate area located below the active semiconductor layer, a metallization level and the like, heat transfer may be initiated from remote positions, thereby providing enhanced flexibility for positioning active heating elements and/or circuit portions, which may be used as a heat source for low temperature sensitive circuit portions.

It should be appreciated that the principles disclosed herein are advantageous for complex integrated semiconductor devices, such as CPUs and the like, since here the complex circuit design may not allow significant redesigns with respect to cold temperature operation without causing significant additional process complexity with respect to establishing a new design and circuit simulation, thereby creating additional production costs. The principles disclosed herein may, however, also be advantageously applied to any complex semiconductor devices, such as complex systems on a single chip, which may include analog circuitry in combination with digital circuitry and/or low voltage circuits in combination with high voltage circuits and the like, since, also in these cases, a redesign in view of reliable cold temperature operation may be associated with significant efforts. Thus, unless specifically set forth in the description or the appended claims, the principles disclosed herein should not be considered as being restricted to a specific design of a semiconductor device.

Figure 1A:
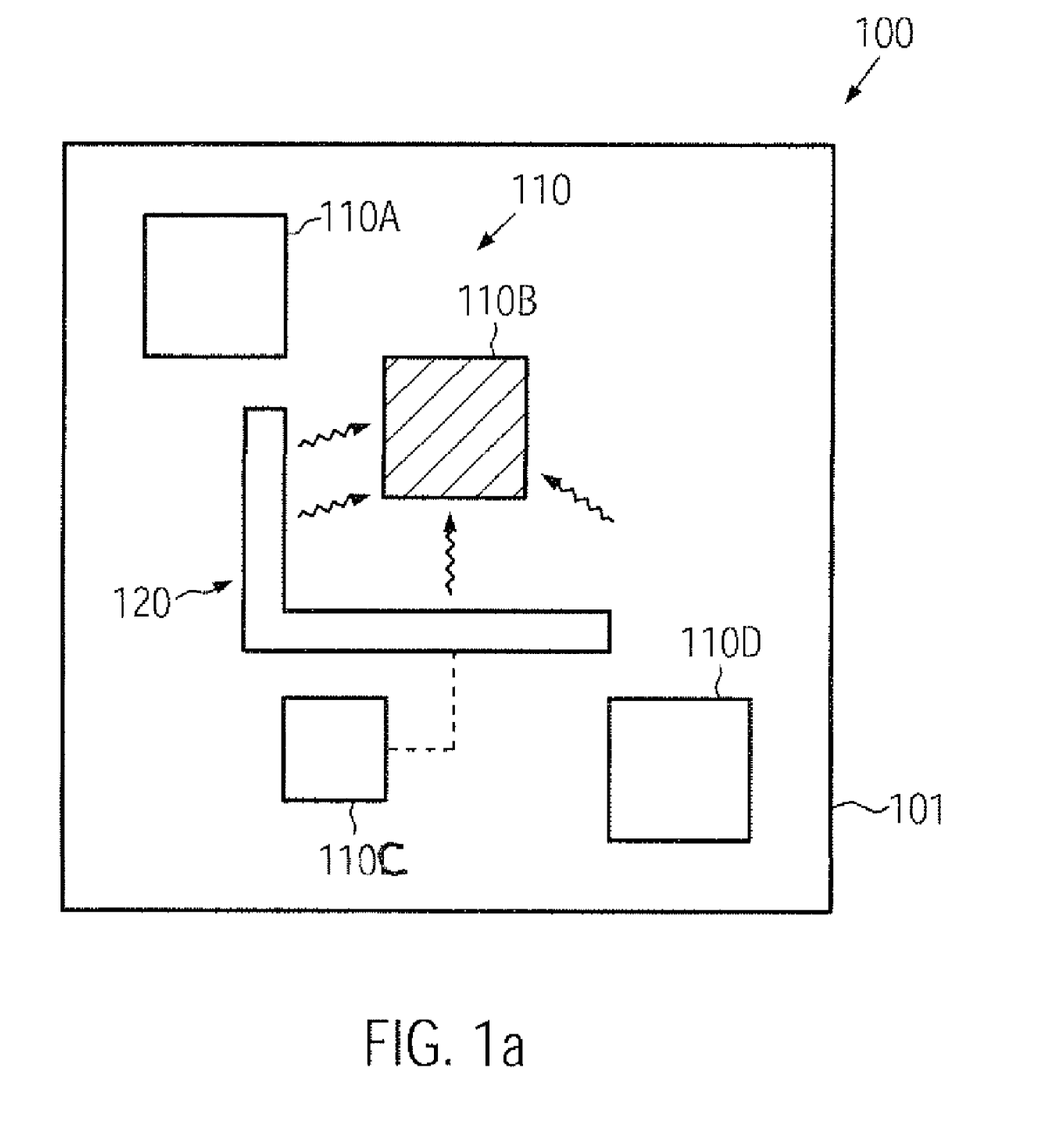
FIG. 1a schematically illustrates a top view of a die region of an integrated circuit including a circuit portion that is sensitive to cold temperature in thermal contact with a mechanism for actively heating the sensitive circuit portion, according to illustrative embodiments.

FIG. 1a schematically illustrates a top view of an integrated circuit 100, which may correspond to a die region of a semiconductor device, wherein the integrated circuit 100 may still be in a manufacturing phase in which a plurality of die regions may be positioned on a single substrate, such as a semiconductor wafer and the like, while, in other cases, the integrated circuit 100 may represent a stand-alone entity, which may be packaged or attached to any other appropriate carrier material for providing electrical connections to peripheral components, depending on the overall configuration. The integrated circuit 100 may comprise a substrate 101, which may be provided in the form of any appropriate carrier material, such as a semiconductor substrate and the like. Attached to and/or in the substrate 101, a plurality of circuit elements may be provided, as will be described later on in more detail, and also respective interconnect structures may be positioned attached to or in the substrate in order to establish the desired circuit arrangement. A plurality of circuit elements and respective interconnect structures define a plurality of circuit portions 110A, 110B, 110C, 110D, which may also be collectively referred to as circuit portions 110. It should be appreciated that a circuit portion may be understood as a functional block which may be operated independently from other functional blocks in the sense that, based on a predefined number of input signals, the portion under consideration may provide one or more output signals. Thus, the input signals may be supplied by other circuit portions while the output signals may be supplied as input signals to other circuit portions so that the function of the overall system may be obtained, while nevertheless a certain degree of independence of operation may exist for the various circuit portions 110A, 110B, 100C, 110D. For example, in a CPU (central processing unit), a clock signal generating portion may represent a circuit portion that may operate on the basis of zero input signals and may provide one or more output signals in the form of clock signals, which may be distributed across the entire integrated circuit 100 in the form of a so-called clock tree, which may be designed to provide the clock signals within a predefined range of clock signal delay to each of the circuit portions 110A, 110B, 110C, 110D. It should be appreciated that, depending on the overall complexity of the integrated circuit 100, a plurality of different circuit architectures may be present, such as asynchronous circuits, which may not require a clock signal for operation, symmetric circuit portions, which may be operated on the basis of a common clock signal, analog circuitry and the like. As previously explained, at least some of the circuit portions 110 may represent temperature sensitive circuit portions with respect to low temperatures in the sense that a reliable operation of these sensitive circuit portions at a low temperature may not be guaranteed. For example, a clock generator may not appropriately lock into a specific basic oscillator signal at cold temperatures, thereby resulting in a failure of properly booting a device or otherwise initializing the integrated circuit 100. In other cases, oscillator circuitries may suffer from an increased frequency shift, thereby also causing the entire system 100 to operate in a non-reliable manner at a low temperature range. For example, it may be assumed that the circuit portion 110B may represent a cold temperature sensitive circuit portion, a reliable operation of which may not be guaranteed at a specific temperature, for instance at a temperature below 0° C. Furthermore, the integrated circuit 100 may comprise an active heating system 120, which may be positioned so as to be in thermal contact with at least the temperature sensitive circuit portion 110B in order to raise the temperature of the portion 110B within a predetermined time interval for given environmental conditions.

For example, the heating system 120 may be configured to enable a temperature raise of approximately 20-40° C. or higher within several seconds for an environmental temperature of approximately −40° C. It should be appreciated however that, depending on the overall requirements, the heating system 120 may be designed in a different manner in order to create different temperature behavior for the circuit portion 110B. Furthermore, it should be understood that the term "in thermal contact" is to be understood such that a given temperature raise within a given time interval may be accomplished in specified environmental conditions, i.e., for a given representative temperature of the portion 110B, for instance for the above-specified conditions, irrespective of the actual spatial relationship between the circuit portion 110B and the heating system 120. It should also be appreciated that the heating system 120, in a more or less degree, also be thermally coupled to the remaining circuit portions 110A, 110C, 110D, however, in some illustrative embodiments, to a significantly reduced degree, thereby enabling a substantially localized or selective heating of the circuit portion 110B. Furthermore, in some illustrative embodiments, the heating system 120 may be provided as an independent circuit portion which may not electrically contribute to the overall electrical functionality of the integrated circuit 100. That is, in some illustrative embodiments, the heating system 120 may not produce an electrical output signal that may be required by other circuit portions so as to fulfill the intended task of these circuit portions. Consequently, the heating system 120 may be deactivated, for instance by discontinuing current flow thereto, without affecting the operational behavior of the device 100 when operated within a specified temperature range for which a reliable operation is specified.

In other illustrative embodiments, as will be described later on, the heating system 120 may represent a part of a functional block of the integrated circuit 100, however with enhanced robustness with respect to cold temperature operation, wherein the system 120 may be operated without requiring input, at least from temperature critical portions, such as the portion 110B, in order to provide its waste heat, at least partially, to the circuit portion 110B, so as to enable proper operation thereof once a specific temperature is reached.

The integrated circuit 100 shown in FIG. 1a may be formed in accordance with well-established process techniques in which corresponding manufacturing techniques may be used to form the circuit elements for defining the various circuit portions 110. On the basis of these manufacturing techniques, the heating system 120 may also be formed, for instance in the device level, i.e., in and on a respective semiconductor layer and/or in the contact level and/or in the metallization system and/or in the substrate 101 and/or attached thereto. Thus, for example, resistive structures may be provided for the system 120 which may be connectable to a power source, such as the supply voltage of the integrated circuit 100, which may be accomplished by a control mechanism implemented in the system 120 or which may be incorporated in one of the circuit portions 110, such as the portion 110C, as illustrated in FIG. 1a, in order to temporarily activate the system 120 on the basis of the operational state of the integrated circuit 100. For example, during a power-up event, the system 120 may be supplied with energy in order to preferably heat the temperature sensitive portion 110B, wherein, after a predetermined time interval or after a desired temperature is reached in the portion 110B, the current flow may be discontinued by appropriately controlling respective transistor elements and the like. This may be accomplished by a control mechanism that may be provided independently from the circuit portions 110 or in combination with at least one of the portions 110. It should be appreciated that the circuit portions 110 may be formed in accordance with well-established design criteria or may be designed on the basis of criteria with respect to temperature behavior as may typically be used in less sophisticated environmental conditions with respect to a low temperature operation, thereby possibly saving on development time and thus production costs, while the heating system 120 may readily be implemented by appropriately positioning well-established circuit components, such as polycrystalline semiconductor lines, metal lines in various device levels, implanted semiconductor regions and the like. In some illustrative embodiments, even device features which may already be present in circuit portions 110 may be used for the heating system 120 by electrically connecting the respective features, such as dummy lines of gate electrode structures and the like, which may frequently be provided to enhance process conditions of critical manufacturing processes, such as lithography, etching and the like.

Figure 1B:
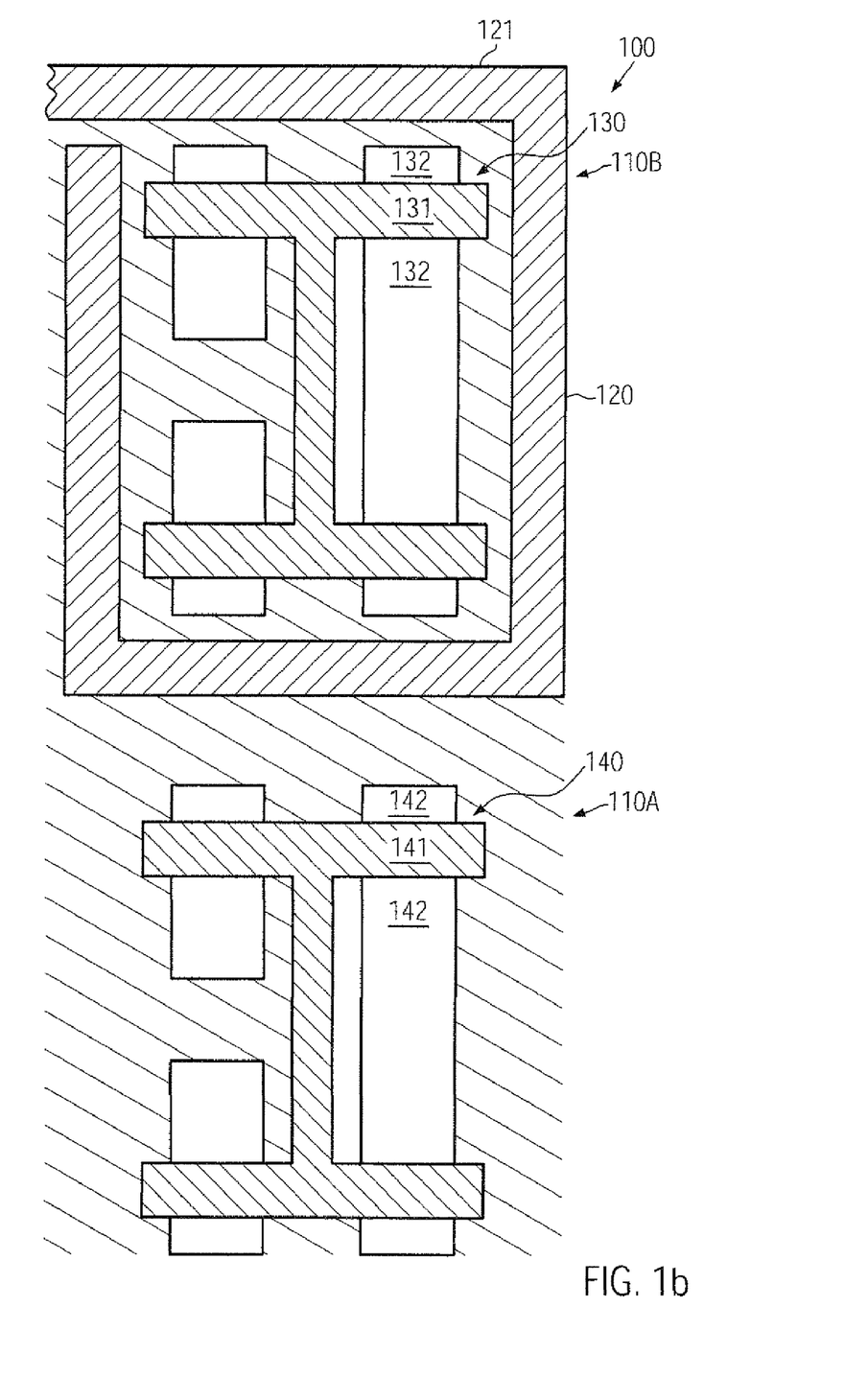
FIG. 1b schematically illustrates a top view of a temperature sensitive circuit and an insensitive circuit at transistor level, wherein the temperature sensitive circuit portion is in thermal contact with a resistive semiconductor structure, according to further illustrative embodiments.

FIG. 1b schematically illustrates a top view of a portion of the integrated circuit 100 in which the temperature critical circuit portion 110B may be represented by a plurality of transistor elements 130, while a substantially non-critical circuit portion, such as the circuit portion 110A, may be represented by transistor elements 140. As illustrated, the transistors 130, 140 may comprise gate electrodes 131, 141, respectively, and drain and source regions 132, 142, respectively. As illustrated, a plurality of transistor cells, represented by the structures 130, 140, may be interconnected as required by the overall circuit configuration. For instance, a complementary transistor pair, each transistor being comprised of a respective elementary transistor cell 130, may be provided so as to, for instance, represent an inverter, or any other basic circuitry. As previously indicated, the transistors 130, 140 may be formed in accordance with well-established process techniques based on design rules corresponding to the integrated circuit 100. For example, in the embodiment shown in FIG. 1b, the transistors 130, 140 may represent field effect transistors wherein the gate electrode structures 131, 141 may be formed on the basis of a gate insulation material, a polysilicon material, possibly in combination with a metal silicide formed thereon. Moreover, the integrated circuit 100 may comprise the heating system 120, a portion of which may be represented by a resistive structure 121, which, in the embodiment shown, may be represented by a "gate electrode" structure which, however, may be appropriately positioned with respect to the circuit portion 110B in order to enhance heat transfer from the resistive structure 121 to the transistors 130 while also providing a high degree of compatibility with the overall design criteria. For example, as shown, the resistive structure 121 may substantially enclose the transistors 130, which may thus result in an efficient heat transfer upon establishing a current flow through the resistive structure 121, for instance by connecting corresponding end portions with a voltage source, which may be accomplished by providing an appropriately designed transistor structure, the drain and source current path of which may be appropriately connected to the resistive structure 121.

As previously explained, the integrated circuit 100 as shown in FIG. 1b may be formed on the basis of well-established process techniques, wherein the resistive structure 121 in the form of a gate electrode structure may be formed during the basic transistor manufacturing process for the devices 130, 140 substantially without adding additional process complexity. Depending on the configuration of the resistive structure 121, the sheet resistivity thereof may be appropriately adjusted, which may be accomplished on the basis of an additional lithography process, for instance for avoiding implantation of the resistive structure 121 and/or by avoiding or otherwise controlling the formation of a metal silicide in the structure 121, when a reduced sheet resistance is desired. In other cases, the overall resistance of the structure 121 may be adjusted on the basis of a length thereof, while substantially the same basic configuration as the gate electrode, for instance with respect to a dopant level, the amount of metal silicide and the like, may be used. For instance, when a moderately high power consumption may be desired in the structure 121, an appropriately low overall resistance value may be generated, while, however, the resistive structure 121 may represent the highest resistance in the overall conductive path connecting a voltage source with the resistive structure 121.

Figure 1C:
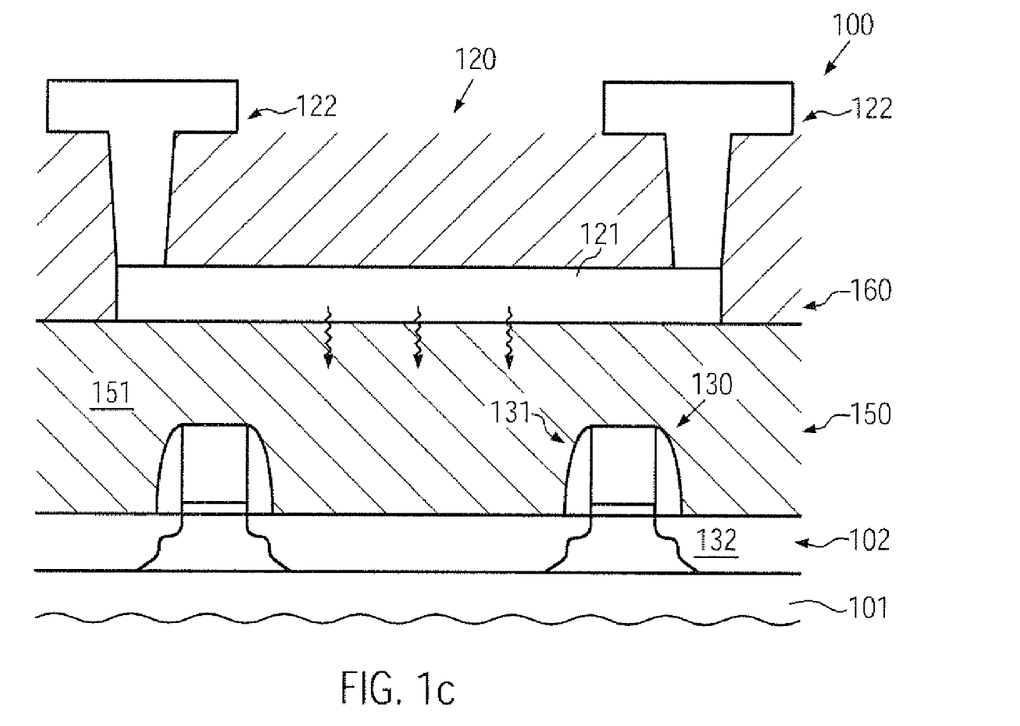
FIGS. 1c-1d schematically illustrate cross-sectional views of a temperature sensitive circuit portion that may be actively heated from above (FIG. 1c) or below (FIG. 1d) of an active semiconductor layer, according to illustrative embodiments.

FIG. 1c schematically illustrates the integrated circuit 100 according to further illustrative embodiments, in which a portion of the heating system 120 may be established above the device level, i.e., within the metallization system of the integrated circuit 100. As illustrated, a semiconductor layer 102, such as a silicon layer, which may comprise other components, such as germanium, carbon and the like for adapting the electronic characteristics thereof, or any other appropriate semiconductor materials, such as semiconductor alloys, III-V compounds, II-VI compounds and the like, may be formed above the substrate 101. It should be appreciated that the substrate 101 and the semiconductor layer 102 may define a silicon-on-insulator (SOI) configuration when a buried insulating layer (not shown) may be provided between the semiconductor layer 102 and the substrate 101. A respective SOI configuration may only be partially realized in the integrated circuit 100, depending on the overall device requirements. Furthermore, the transistors 130 comprising the drain and source regions 132 and the gate electrode structure 131 may be enclosed and passivated by a contact layer 150, which may comprise an appropriate dielectric material 151 in which contact elements (not shown) may be formed. Furthermore, a metallization system 160 may be formed above the contact level 150 and may comprise one or more metallization layers, as required for providing the corresponding mutual electrical connections of the circuit elements corresponding to the overall circuit arrangement. Moreover, in the embodiment shown, the metallization system 160 may comprise at least a portion of the heating system 120, for instance in the form of a metal-containing resistive structure 121 in combination with respective contact elements 122, which may be provided in the form of vias and metal lines formed in a higher metallization level. It should be appreciated that the heating system 120 may further comprise components in the device level represented by the semiconductor layer 102, for instance in the form of an appropriately dimensioned transistor and the like, so as to enable a selective activation of the system 120, i.e., for providing a controlled current flow through the resistive structure 121. For convenience, any such further components in the device level 102 and also in the metallization system 160 so as to connect to the contact portions 122, are not shown. Also, in this case, an efficient heat transfer may be established from the resistive structure 121 to the temperature sensitive transistor elements 130 via the contact level 150, wherein any metal contact contained therein may even further enhance the overall thermal conductivity between the resistive structure 121 and the transistors 130. As previously explained, also in this case, the resistive structures 121 and the respective contact portions 122 may be formed on the basis of well-established techniques used for forming other metal features in the metallization system 160. For example, the overall resistance of the resistive structure 121 may be adjusted on the basis of the dimensions of the structure 121, for instance in the form of line width and an overall length thereof, while other characteristics, such as material composition and the like, may be the same as for other metal features in the same metallization level of the system 160. In other cases, if additional process steps are considered appropriate, the electrical behavior of the structure 121 may be adjusted on the basis of appropriate material treatments, which may be selectively applied to the structure 121, while covering other metal features in the system 160.

Figure 1D:
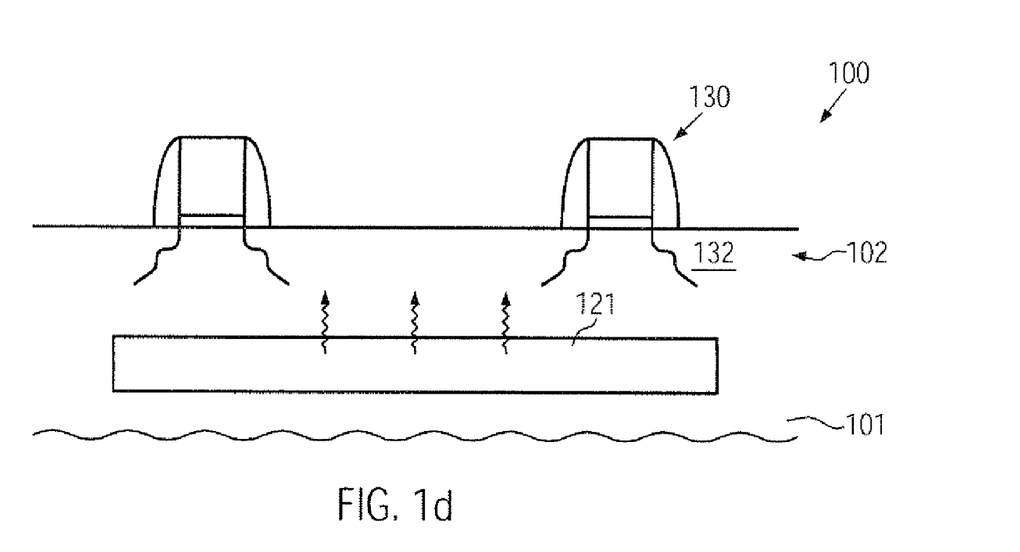

FIG. 1d schematically illustrates the integrated circuit 100 according to further illustrative embodiments in which a portion of the heating system 120, for instance the resistive structure 121 in combination with appropriate contact portions (not shown), may be positioned below the semiconductor layer 102 and thus within the substrate 101. For example, if the semiconductor layer 102 may be provided above the substrate 101 without an intermediate buried insulating material, the structure 121 may be provided in the form of a buried conductive line, for instance in the form of an appropriately doped semiconductor line, which may be electrically isolated to adjacent semiconductor areas by appropriate techniques, such as an appropriate well implantation and the like. In other cases, the buried resistive structure 121 may be formed during a process sequence when forming trench isolation structures (not shown) during which appropriate trenches may be formed in the semiconductor layer 102, which may be subsequently filled with an insulating material. Thus, during a corresponding manufacturing process, the buried resistive structure 121 may also be formed, for instance as a corresponding line or plate, by depositing an appropriate material, implanting dopant species into the trench openings and the like. It should be appreciated that, in some illustrative embodiments, when a buried insulating layer may be provided, the resistive structure 121 may be formed below the buried insulating layer by etching through the layer or by implanting a dopant species through the buried insulating material, thereby positioning the resistive structure 121 in the vicinity of the transistor elements 130, while nevertheless providing reliable electrical insulation of the structure 121 with respect to the semiconductor layer 102.

Figure 1E:
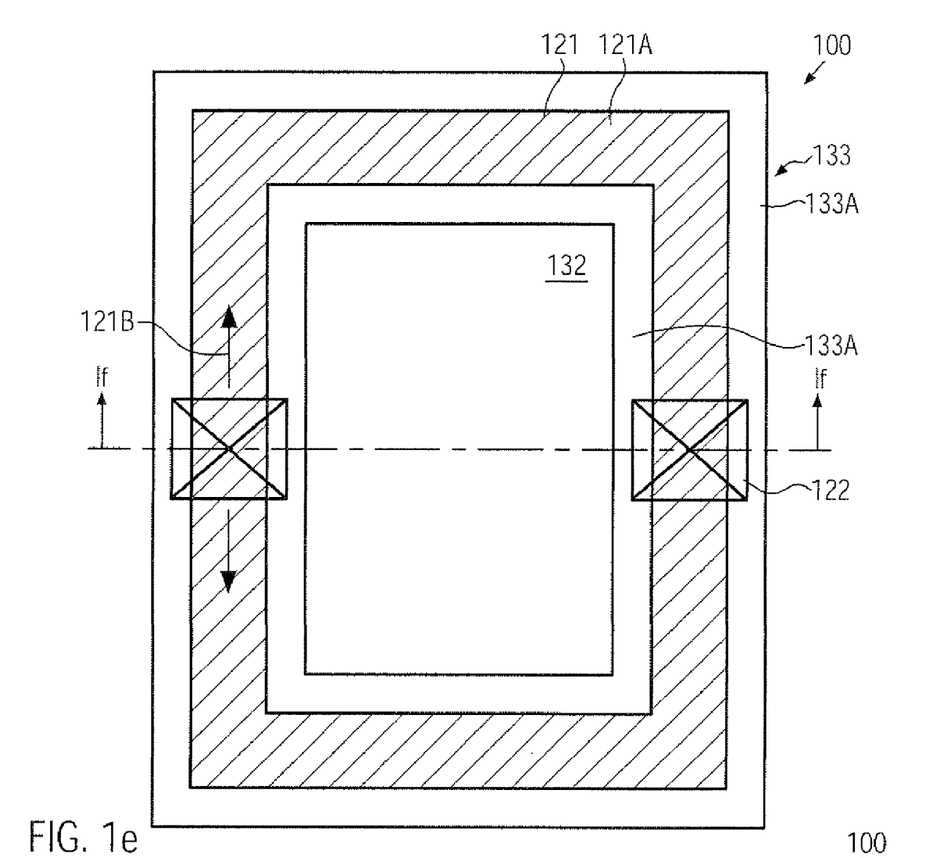
FIGS. 1e-1f schematically illustrate a top view and a cross-sectional view, respectively, of a heating element provided in a highly localized manner within an isolation trench, according to further illustrative embodiments.

FIG. 1e schematically illustrates a top view of a portion of the integrated circuit 100, which may represent an active region for one or more of the transistors 130, which may, for convenience, also be indicated as regions 132, since the drain and source regions may have to be formed therein by ion implantation or any other means in a later manufacturing stage. Furthermore, as illustrated, a trench isolation structure 133 may be formed and may laterally enclose the active region 132, thereby providing a lateral electrical insulation of the region 132 with respect to neighboring circuit elements. In the embodiment shown, the resistive structure 121 may be incorporated into the trench isolation structure 133, thereby providing a space efficient configuration while nevertheless maintaining a high degree of design and process compatibility. For this purpose, the isolation structure 133 may comprise a conductive material 121A, for instance in the form of a polysilicon material, possibly in an appropriately doped state, which may be laterally enclosed by a dielectric material 133A, such as silicon dioxide, silicon nitride and the like, as may typically be used in conventional trench isolation structures. Furthermore, appropriate positions for forming contact elements 122 may be selected in order to obtain a desired current flow through the structure 121, wherein, in some illustrative embodiments, the corresponding positions for the contact elements 122 may be advantageously selected such that approximately identical resistance values may be obtained for both current flow directions, as indicated by the arrows 121B.

Figure 1F:
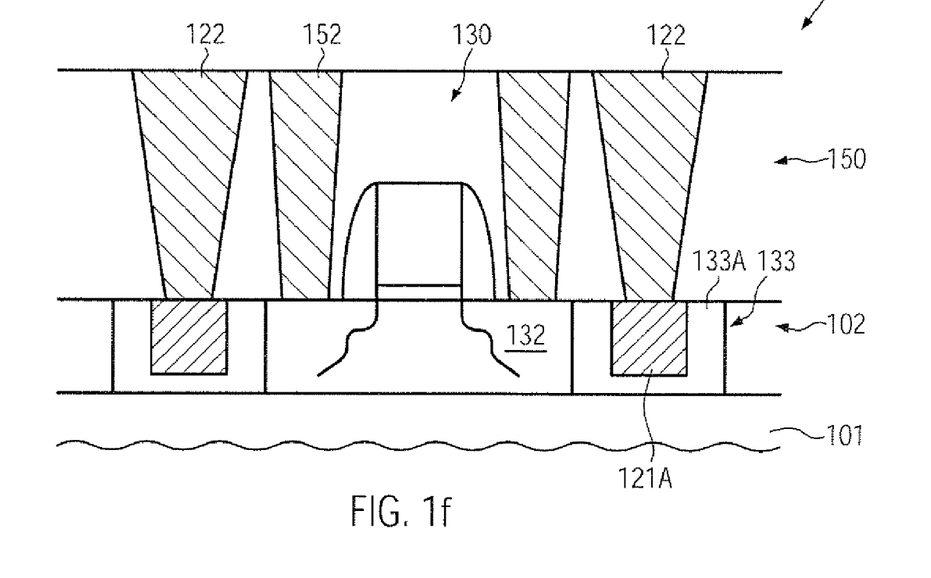

FIG. 1*f* schematically illustrates a cross-sectional view, according to the line I*f* of FIG. 1*e*, at an advanced manufacturing stage. As illustrated, the integrated circuit 100 may comprise the transistor 130 formed in and above the semiconductor layer 102, wherein the transistor active region may be enclosed by the trench isolation structure 133. As shown, the conductive material 121A of the resistive structure 121 may be formed within the insulating material 133A, thereby providing the desired electrical insulation with respect to the neighboring circuit elements, such as the transistor 130. Furthermore, the contact level 150 is formed above the semiconductor layer 102 and comprises the contact elements 122 connecting to the resistive structure 121 at appropriate positions, as previously explained above with reference to FIG. 1*e*, while also contact elements 152 may be provided so as to connect to the one or more transistors 130.

The integrated circuit 100 as shown in FIG. 1*f* may be formed on the basis of the following processes. Appropriate trenches may be formed in the semiconductor layer 102 to define the active region 132, as shown in FIG. 1*e*, wherein a width of the respective trenches may be adapted so as to allow a reliable filling in of the materials 133A and 121A. Thereafter, after a possible corner rounding by thermal oxidation, the material 133A may be formed by a conformal deposition technique, such as chemical vapor deposition (CVD), on the basis of appropriate precursor materials for forming silicon dioxide, silicon nitride and the like. Next, a conductive material, such as polysilicon and the like, may be deposited, for instance in an appropriately doped state, depending on the desired overall resistance required for the structure 121. Next, any excess material of the previously deposited materials, such as the polysilicon, the silicon dioxide and the like, may be removed by an appropriate planarization technique, such as chemical mechanical polishing (CMP) and the like. Thereafter, well-established transistor manufacturing techniques may follow to form the transistors 130, and the contact level 150 may be formed in accordance with well-established process strategies. Thereafter, the contact elements 152 and 122 may be formed in a common manufacturing sequence using well-established techniques, wherein a corresponding lithography mask may be appropriately adapted to position the contact openings for the contacts 122 at the desired positions above the conductive material 121A within the isolation trenches 133. Consequently, a high degree of compatibility with conventional process strategies may be accomplished, while a highly localized provision of a heat mechanism may be realized. It should be appreciated that any further circuit elements, for instance required for controlling the activation of the resistive structure 121, may be provided in the device level, for instance in the form of transistor elements and the like, as is also previously explained.

Figure 1G:
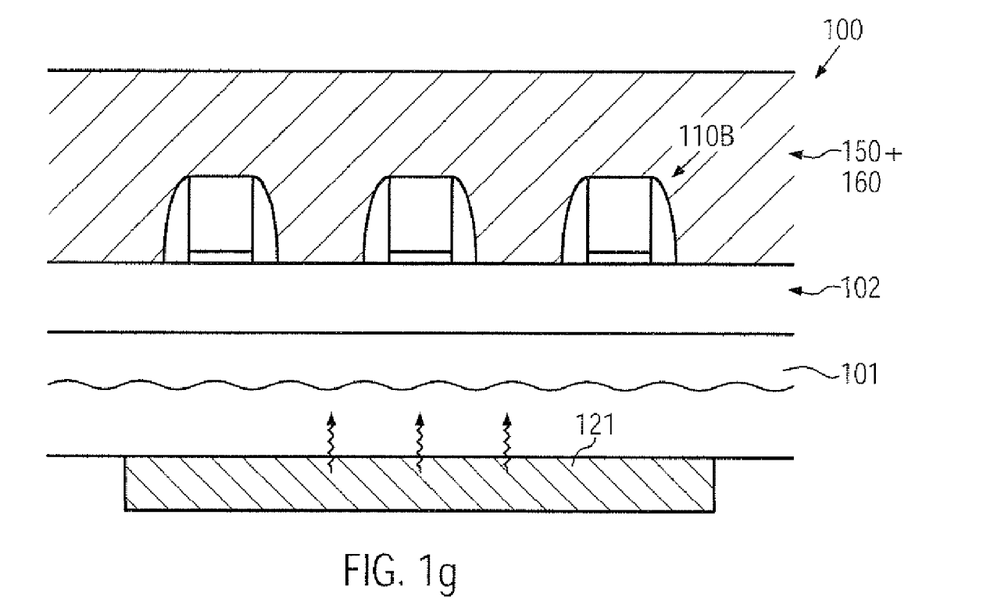
FIG. 1g schematically illustrates a portion of an integrated circuit that is thermally coupled to a heating element that may be provided from the back side of a substrate, according to still further illustrative embodiments.

FIG. 1*g* schematically illustrates the integrated circuit 100 in accordance with illustrative embodiments in which a portion of the heating system, i.e., the resistive structure 121, may be positioned at the back side of the substrate 101 or may at least be formed from the back side of the substrate 101, thereby also providing a buried configuration. For example, the resistive structure 121 may be provided in the form of an appropriate metal-containing structure attached to the substrate 101 so as to enable a more-or-less spatially selective heating of the temperature sensitive circuit portion 110B. Also, in this case, an appropriate interconnect structure may be provided in the form of any active switching elements in the device level in order to connect the resistive structure 121 in a controllable manner to an appropriate voltage source, as previously explained.

Figure 1H:
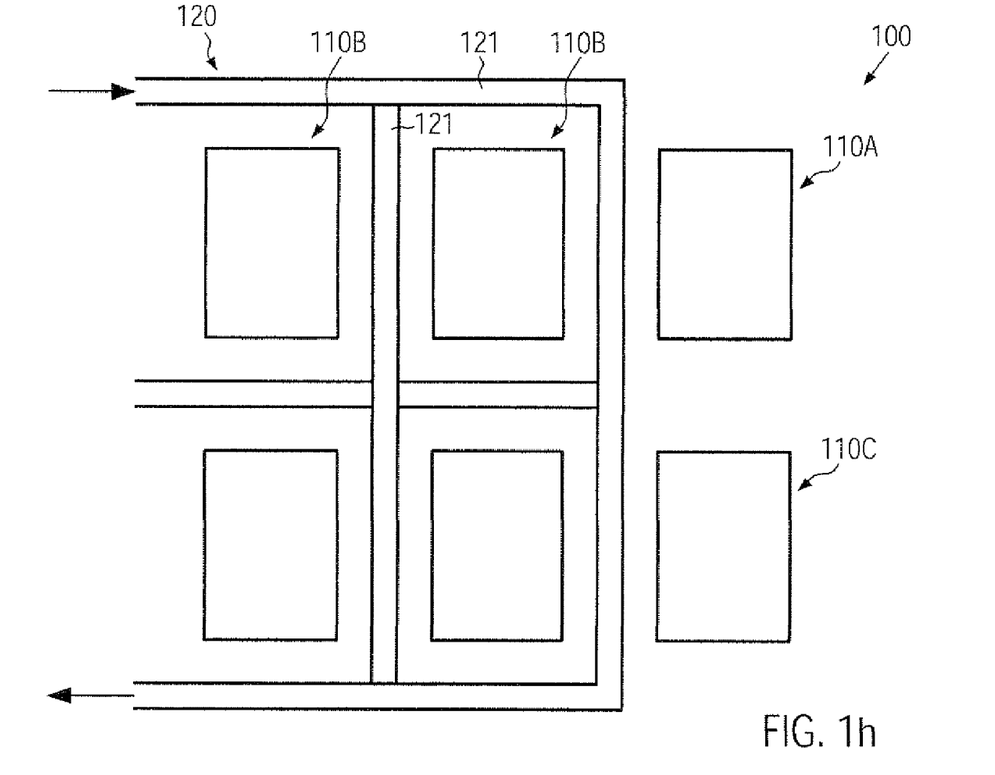
FIG. 1h schematically illustrates a top view of an integrated circuit comprising a plurality of temperature sensitive circuit portions, which may be in thermal contact with a plurality of resistive structures, according to still further illustrative embodiments.

FIG. 1*h* schematically illustrates a top view of the integrated circuit 100, in which a more global version of the heating system 120 may be used in combination with one or more temperature sensitive circuit portions 110B. For example, a plurality of circuit portions 110B, each of which may be comprised of a plurality of circuit elements, may be provided in the integrated circuit 100, wherein a corresponding network of resistive structures 121 may be positioned in close proximity to each of the temperature sensitive circuit portions 110B so as to enable efficient heat transfer without requiring significant design modifications, for instance with respect to the positioning of the circuit portions 110B. The network of the resistive structures 121 may be realized in one or more device levels, as is previously explained. That is, the resistive structures 121 may be comprised of semiconductor material within the active semiconductor layer and/or the structures 121 may be comprised of gate electrode material, such as polysilicon, formed above the semiconductor layer and/or metal-containing structures may be used in the metallization system and also buried resistive structures may be used, for instance in view of reducing overall surface area consumed by the heating system 120. Consequently, the overall design for the temperature sensitive portions 110B may be similar to non-critical portions, such as the circuit portions 110A, 110C, since the resistive structures 121 may be provided in a highly space-efficient manner.

Figure 1I:
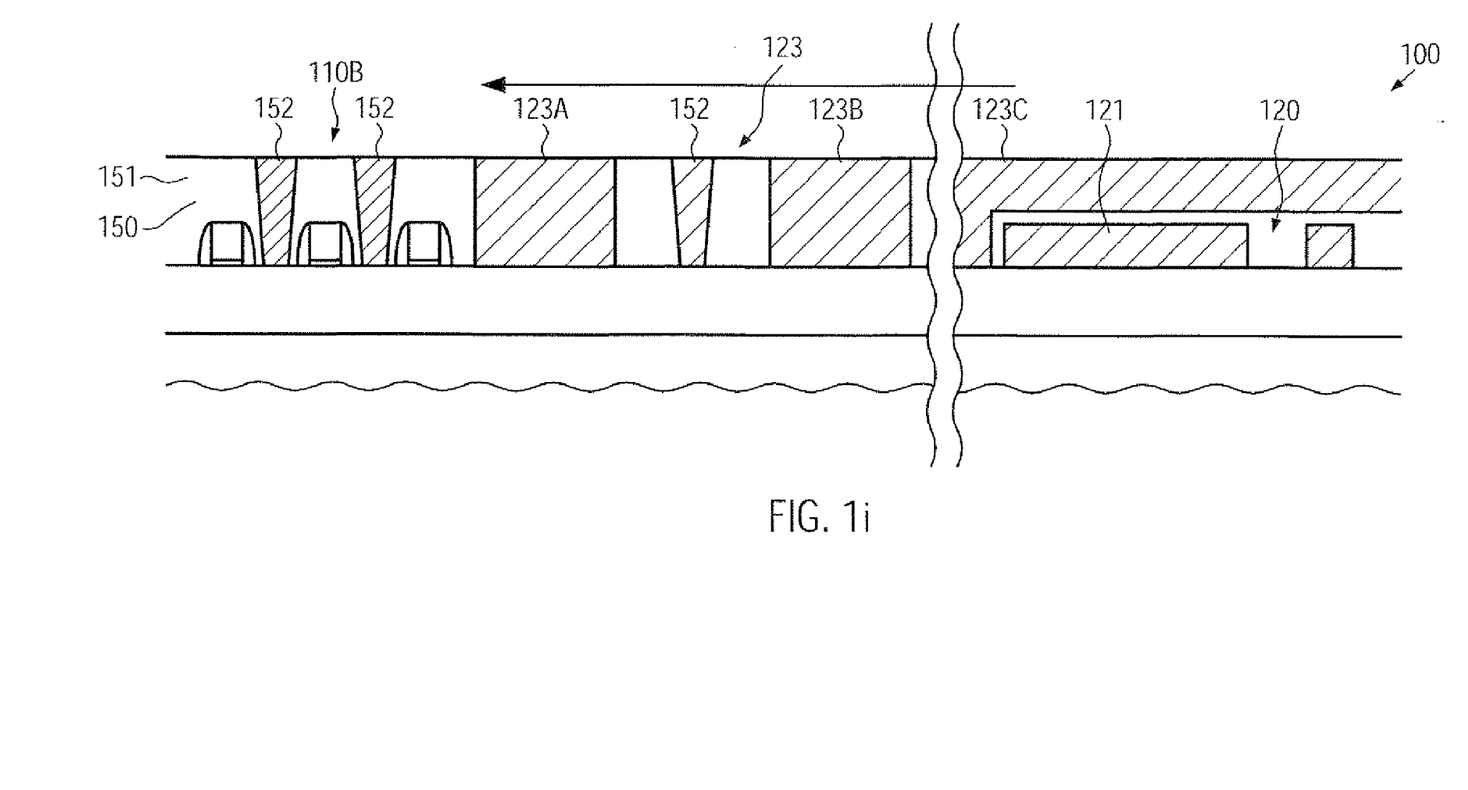
FIG. 1*i* schematically illustrates a cross-sectional view of a portion of an integrated circuit in which a low thermal resistance may be established in a contact level of the integrated circuit so as to thermally couple a temperature sensitive circuit portion with a remote active heating element, according to illustrative embodiments.

FIG. 1*i* schematically illustrates the integrated circuit 100 in combination with the heating system 120 according to illustrative embodiments in which the actual active heat generation may occur remotely to the temperature sensitive portion 110B, wherein, nevertheless, an efficient heat transfer mechanism may be established by appropriately increasing the thermal conductivity between the portion 110B and a heating element, for instance in the form of the resistive structure 121 and the like. Furthermore, a thermal conductive path 123 may be established in any appropriate device level, wherein, in the embodiment shown, the contact level 150 may be used for incorporating thermally conductive portions in order to define the thermally conductive path 123. The contact level 150 may represent an appropriate location for establishing the path 123, since it is in close contact to relevant circuit elements of the portion 110B, while nevertheless providing a certain degree of design freedom compared to the device level and also with respect to the metallization level, since the contact level may be substantially "populated" by vertical contact elements of relatively small lateral dimensions, while other device areas may require a plurality of circuit elements, the lateral dimensions of which, at least in one direction, may be significantly higher, such as metal lines, a transistor width and the like. For example, the thermally conductive path 123 may comprise a plurality of dummy contact elements 123A, 123B, 123C which may define the path 123, since typically the metal contained therein may exhibit a significantly higher thermal conductivity compared to the dielectric material 151. However, the dummy contact elements 123A, 123B, 123C may not necessarily be connected with each other in order to provide the required electrical insulation when "crossing" regular contact elements 152, wherein, however, a reduced thermal resistance may be obtained since the regular contact elements 152 positioned between dummy elements 123A, 123B may nevertheless provide a moderately low overall thermal resistance. Consequently, if design criteria for critical circuit portions may not allow the positioning of a resistive structure 121 directly adjacent to the critical circuit portions without significant design modifications, the heating system 120 may be positioned at any appropriate location in the wider neighborhood of the circuit portion 110B, while the thermally conductive path 123 may nevertheless provide an efficient thermal coupling of the resistive structure 121 and the portion 110B.

Figure 1J:
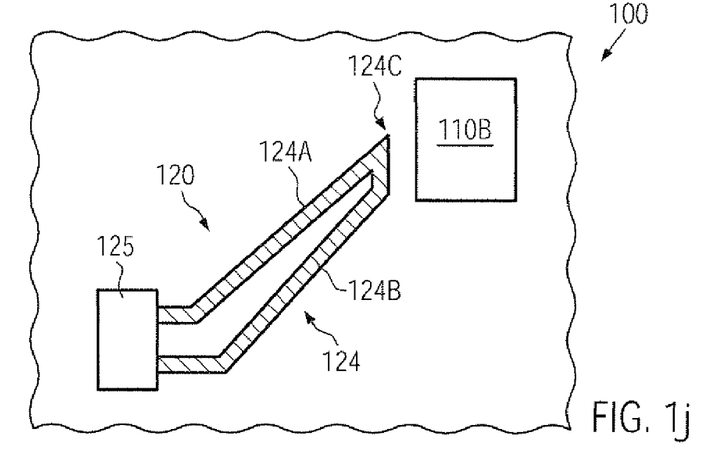
FIG. 1*j* schematically illustrates a top view of an integrated circuit including a thermal couple for heat transfer between a temperature sensitive circuit portion and a remote heat reservoir, according to further illustrative embodiments.

FIG. 1j schematically illustrates the integrated circuit 100 including the heating system 120, which may comprise a thermocouple that may be established in any appropriate device level, such as the contact level 150. As illustrated, a thermocouple 124 comprises a first conductive line 124A and a second conductive line 124B, each of which may include a different type of conductive material, such as different types of metals, that may be connected at an interface portion 124C such that a temperature gradient along the conductive lines 124A, 124B may result in a voltage difference due to the interface 124C, according to the well-known thermo electric effect. For example, the conductive lines 124A, 124B may comprise copper and constantan, respectively, so as to obtain a specific thermo electric response for a specified temperature range, defined by the selected metals. Moreover, the metal lines 124A, 124B may be connected to an appropriate control circuitry for driving a current through the thermocouple 124, possibly in combination with sensing a voltage difference between the conductive lines 124A, 124B. As indicated above, the conductive lines 124A, 124B may, in some illustrative embodiments, be implemented in the contact level 150 of the integrated circuit 100, thereby providing an efficient thermal coupling to the lower lying device level, while also providing sufficient design flexibility in appropriately routing the metal lines 124A, 124B between the location of the control circuitry 125 and the temperature sensitive circuit portion 110B. It should be appreciated that a portion of the conductive lines 124A, 124B and the interface 124C may be positioned directly above the circuit portion 110B, if desired, while, in other cases, the respective components may be positioned in close proximity to the portion 110A. Consequently, by driving a current through the thermocouple 124, heat may be transferred between the positions 125 and the circuit portion 110B, which in the case of a low temperature condition may be accomplished such that heat may be generated and be transferred to the portion 110B. On the other hand, after the circuit portion 110B may be operated in an allowable temperature range, excessive heat generated in the portion 110B, if desired, may be removed via the thermocouple 124 by reversing the current flow direction. Thus, also in this case, an appropriate routing of the thermo coupling 124 may be established, for instance in the contact level 150, thereby enabling an efficient remote heat generation and an efficient heat transfer during cold temperature conditions.

Figure 1K:
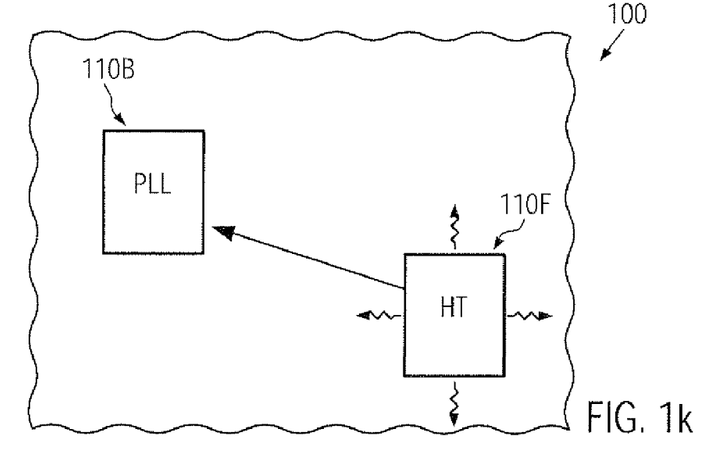
FIGS. 1*k*-1*l* schematically illustrate top views of an integrated circuit including a cold temperature sensitive circuit portion, a circuit portion that may create excessive heat during normal operation, which may be used for raising the temperature of the cold temperature sensitive circuit portion during a cold temperature operating mode, according to illustrative embodiments.

FIG. 1k schematically illustrates the integrated circuit 100 according to a configuration in which a circuit portion 110F may be identified as a circuit portion that may create excessive heat shortly after activating the circuit portion 110F. In this case, the dissipated heat may be advantageously used for heating up a sensitive circuit area, such as the portion 110B, for instance by providing an appropriate heat transfer mechanism, such as a thermally highly conductive path, as previously described with reference to FIG. 1i, while in other cases appropriately designed thermocouples may be used, as previously discussed with reference to FIG. 1j. For example, in complex CPUs, frequently, floating point units may be used to enhance overall performance with respect to complex arithmetic operations. Since respective functional units may provide a moderately high amount of heat, due to the plurality of critical signal paths contained therein, the waste heat may be advantageously used for heating up cold temperature critical areas, such as phase locked loop units, delay locked loop units, oscillators and the like.

Figure 1L:
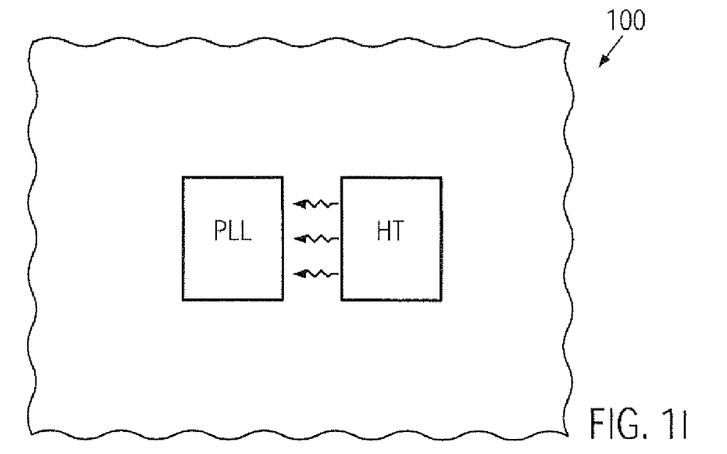

FIG. 1l schematically illustrates the integrated circuit 100 according to further illustrative embodiments in which the overall design may be slightly modified with respect to the configuration as shown in FIG. 1k, in order to position the heat generating circuit portion 110F closer to the temperature sensitive portion 110B in order to establish an enhanced thermal coupling. However, any design modifications of the circuit architectures of both the portion 110F and the portion 110B may not be required, so that well-established circuitries may still be used. For example, if the temperature sensitive portion 110B may not be required during the power-up of the integrated circuit 100, the circuit portion 110F may be activated for a certain time interval during the initialization, thereby heating one or more neighboring circuits, such as the portion 110B, which may then be initialized so as to operate in a normal manner.

Figure 2:
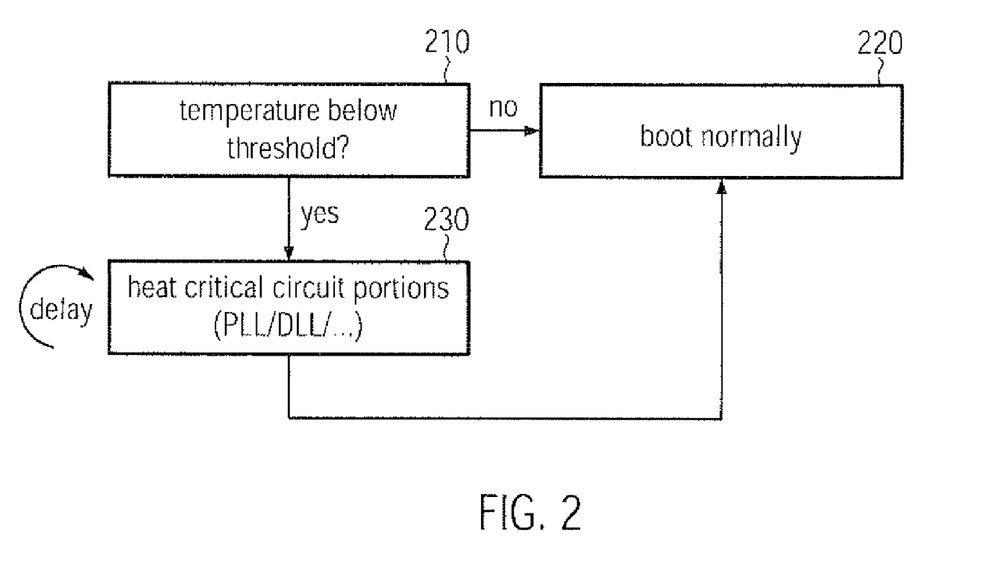
FIG. 2 schematically illustrates a flow diagram of an operational mode for extending reliable operation of an integrated circuit to cold temperatures, according to illustrative embodiments.

With reference to FIG. 2, respective operating modes of the integrated circuit 100 will be described. As previously explained, providing heating elements, for instance in the form of resistive structures and the like, may provide the possibility of "pre-heating" at least cold temperature sensitive device areas prior to actually initializing the normal operational mode. This may be accomplished upon detecting an inappropriate temperature at least at a critical circuit portion, for instance by die internal thermal sensing circuitry, as may typically be provided in complex circuit designs, for instance in the form of diode structures, thermo-couples and the like, which may be connected to appropriate sensing circuitries. Thus, upon monitoring the temperature, that is, a representative temperature value that indicates the thermal condition of a critical circuit portion, a controlled heating of highly localized areas of a die or even a more global heating may be enabled on the basis of the corresponding detected temperature. In other cases, an inappropriate temperature may be determined on the basis of the detection of a certain operational state, for instance by detecting a power-up event, it may be assumed by the heating system that the temperature of sensitive circuit portions is inappropriate and a heating thereof may be required for a specified time period prior to initializing the normal operating mode.

FIG. 2 schematically illustrates a flow diagram of illustrative embodiments in which the initialization of the integrated circuit 100 may be performed on the basis of a determined temperature. Thus, according to block 210, it may be determined whether or not a representative temperature value of at least one critical circuit portion is below a predefined threshold. For instance, corresponding information may be obtained on the basis of a temperature signal of a temperature sensitive element positioned in close proximity to a critical circuit portion, which may be supplied to a control section of the heating system 120 in order to assess whether or not heating of the critical circuit portion may be required. If in block 210 it is determined that the representative temperature is not below the predefined threshold, the initialization of a critical circuit portion may be performed in a normal manner, for instance, the initialization sequence for the various components of the integrated circuit 100, such as a CPU core, system memory, clock tree and the like may be performed in accordance with a sequence designed in a temperature range at which reliable operation has been verified. If in block 210 it is determined that the temperature is below a predefined threshold, in block 230, at least the critical circuit portion may be heated, for instance by activating respective heating elements, such as the resistive structures previously described.

As previously explained, the activation of the resistive structures 121 or of any appropriate circuit portions, such as the portion 110F, may be initialized by a control section, which may be accomplished by any appropriate circuitry which may provide a certain degree of delay so as to raise the temperature of the critical circuit portion. In other cases, block 230 may comprise a respective control loop, in which the current temperature may be determined and the heating of the critical circuit portions may be maintained until a specific temperature condition may be obtained. A corresponding control mechanism may be implemented into temperature non-critical circuit portions while in other cases a certain delay may be realized by providing simple analog circuitry in combination with an RC (resistance capacitance) element. Thereafter, the process flow may advance to block 220 so as to initiate the normal power-up sequence, as previously explained.

As a result, the present disclosure provides integrated circuits and methods of operating the same wherein reliable operation of the integrated circuit may be guaranteed at lower temperatures, which may be accomplished by leveraging existing process elements to provide enhanced design stability, without requiring significant circuit simulation or redesign of well-approved circuit architectures. Depending on the overall strategy, the heating of critical circuit portions may be performed in a highly local manner so that the amount of energy may be maintained at a very low level, wherein the heating may also be limited to short time intervals, thereby further reducing the overall amount of energy required. In other cases, a global heating may be initiated during specific operating phases, for instance when a low temperature is indicated by die internal temperature sensing circuitry or when a power-up event occurs, so that the integrated circuit may be maintained or may be brought into a safe operating range. In some illustrative embodiments, an appropriate initialization sequence may be implemented into the integrated circuit such that the heating may be initialized only when required, wherein a time interval necessary for bringing respective circuit portions into a normal range of operating temperature may be moderately short, for instance several tenths of milliseconds to several seconds, which may not even be noticeable by a user since the corresponding time interval may be relatively short compared to the entire initialization sequence, for instance when booting computer systems and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a plurality of circuit elements representing a functional circuit portion formed in a die region;
   at least one heating element formed in said die region, said at least one heating element being functionally independent from said functional circuit portion and thermally coupled thereto, wherein said at least one heating element comprises a resistive structure positioned in a substrate layer of said die region under at least one of said plurality of circuit elements; and
   a control mechanism configured to activate said at least one heating element at least when a temperature of said functional circuit portion is below a specified threshold.

2. The semiconductor device of claim 1, wherein said at least one heating element comprises a resistive structure in a semiconductor layer of said die region.

3. The semiconductor device of claim 2, wherein said at least one heating element comprises a resistive structure formed above said semiconductor layer and wherein said resistive structure comprises a semiconductor material.

4. The semiconductor device of claim 1, wherein said at least one heating element comprises a resistive structure as a metal region in a metallization level of said semiconductor device.

5. The semiconductor device of claim 1, wherein said at least one heating element comprises a resistive structure located in a substrate material of said semiconductor device.

6. The semiconductor device of claim 1, wherein said at least one heating element comprises a thermocouple.

7. The semiconductor device of claim 1, wherein said at least one heating element comprises a resistive structure formed in a trench isolation structure that laterally isolates at least one of said plurality of circuit elements.

8. The semiconductor device of claim 1, wherein said control mechanism comprises a temperature sensitive element located so as to be in thermal contact with said functional circuit portion and configured to provide a temperature signal indicating a representative current temperature of said functional circuit portion.

9. The semiconductor device of claim 1, wherein said control mechanism is configured to activate said at least one heating element during a power-up event.

10. A semiconductor device, comprising:
    a temperature sensitive circuit portion comprising a plurality of circuit elements formed in and above a semiconductor layer; and
    a second circuit portion formed at least in and above said semiconductor layer and positioned to be in thermal communication with said temperature sensitive circuit portion, said second circuit portion being configured to be activated independently from said temperature sensitive circuit portion at least when a representative current temperature thereof is below a specified threshold, wherein said second circuit portion comprises a resistive semiconductor structure that laterally encloses at least a portion of at least some of said plurality of circuit elements of said temperature sensitive circuit.

11. The semiconductor device of claim 10, wherein said second circuit portion comprises a resistive semiconductor structure formed above said semiconductor layer.

12. The semiconductor device of claim 10, wherein said second circuit portion comprises a control section configured to monitor said representative temperature and to activate said second circuit portion.

13. The semiconductor device of claim 10, wherein a part of said second circuit portion represents a functional portion including a plurality of transistor elements as heating elements.

14. The semiconductor device of claim 10, wherein said second circuit portion comprises a resistive structure in a metallization level as a heating element.

15. The semiconductor device of claim 10, wherein said second circuit portion comprises a thermocouple as a heat transfer unit.

16. The semiconductor device of claim 15, wherein said thermocouple comprises a first metal in a first conductive line and a second metal in a second conductive line, and wherein said first and second metals differ from each other.

17. The semiconductor device of claim 16, wherein said first and second conductive lines are at least partially formed in an interlayer dielectric material formed above said semiconductor layer and isolating said plurality of circuit elements from a metallization level of said semiconductor device.

18. The semiconductor device of claim 10, wherein said second circuit portion comprises a floating point unit and wherein said temperature sensitive circuit portion and said floating point unit are parts of a central processing unit.

19. A method, comprising:
   determining a representative temperature of at least one circuit portion of an integrated circuit; and
   supplying heat to said at least one circuit portion using a resistive structure located below the at least one circuit portion in a semiconductor substrate layer, when said determined representative temperature is below a specified threshold.

20. The method of claim 19, wherein said representative temperature is determined at least during a power-up phase.

21. The method of claim 19, wherein heating said at least one circuit portion comprises selectively heating said at least one circuit portion while not actively heating one or more second circuit portion of said integrated circuit.

22. The method of claim 20, further comprising heating said at least one circuit portion for a predefined time interval and initializing said at least one circuit portion after said predefined time interval.

23. The method of claim 19, wherein heating said at least one circuit portion comprises selectively energizing at least one heating element that is functionally independent from said at least one circuit portion.

24. The method of claim 23, wherein heating said at least one circuit portion comprises energizing a resistive structure that is otherwise non-energized when said representative temperature is above said predefined threshold.

25. The method of claim 19, wherein said predefined threshold is approximately 0° C. or less.

* * * * *